United States Patent
Hembree et al.

(10) Patent No.: US 6,300,782 B1
(45) Date of Patent: Oct. 9, 2001

(54) SYSTEM FOR TESTING SEMICONDUCTOR COMPONENTS HAVING FLEXIBLE INTERCONNECT

(75) Inventors: David R. Hembree; Derek Gochnour, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/872,434

(22) Filed: Jun. 4, 2001

Related U.S. Application Data

(62) Division of application No. 09/756,626, filed on Jan. 8, 2001, now Pat. No. 6,242,931, which is a division of application No. 09/304,227, filed on May 3, 1999, now Pat. No. 6,263,566.

(51) Int. Cl.[7] .......................... G01R 31/26; G01R 31/02; H01R 43/16; H01R 43/20
(52) U.S. Cl. .......................... 324/760; 324/754; 324/755; 324/757; 324/762; 324/765; 29/874; 29/876; 438/14
(58) Field of Search .................. 324/760, 765, 324/757, 762, 755, 754; 29/874, 876; 438/14

(56) References Cited

U.S. PATENT DOCUMENTS

| | | |
|---|---|---|
| D. 401,567 | 11/1998 | Farnworth et al. . |
| 4,812,191 | 3/1989 | Ho et al. . |
| 5,002,901 | 3/1991 | Kurtz . |
| 5,072,289 | 12/1991 | Sugimoto et al. . |
| 5,172,050 | 12/1992 | Swapp . |
| 5,483,741 | 1/1996 | Akram et al. . |
| 5,592,736 | 1/1997 | Akram et al. . |
| 5,607,818 | 3/1997 | Akram et al. . |
| 5,634,267 | 6/1997 | Farnworth et al. . |
| 5,639,692 | 6/1997 | Teong . |
| 5,656,552 | 8/1997 | Hudak et al. . |
| 5,678,301 | 10/1997 | Gochnour et al. . |
| 5,686,317 | 11/1997 | Akram et al. . |
| 5,691,649 | 11/1997 | Farnworth et al. . |
| 5,716,218 | 2/1998 | Farnworth et al. . |
| 5,726,075 | 3/1998 | Farnworth et al. . |
| 5,739,579 | 4/1998 | Chiang et al. . |
| 5,756,370 | 5/1998 | Farnworth et al. . |
| 5,763,310 | 6/1998 | Gardner . |
| 5,783,461 | 7/1998 | Hembree . |
| 5,789,271 | 8/1998 | Akram . |
| 5,808,360 | 9/1998 | Akram . |
| 5,815,000 | 9/1998 | Farnworth et al. . |
| 5,817,572 | 10/1998 | Chiang et al. . |
| 5,834,366 | 11/1998 | Akram . |
| 5,834,945 | 11/1998 | Akram et al. . |
| 5,838,161 | 11/1998 | Akram et al. . |
| 5,841,197 | 11/1998 | Adamic, Jr. . |
| 5,844,418 | 12/1998 | Wood et al. . |

(List continued on next page.)

OTHER PUBLICATIONS

H. Lorenz et al., "EPON SU–8: A Low–Cost Negative Resist for Mems", Suss Report, Third/Fourth Quarter, 1996, pp. 1–3.

*Primary Examiner*—Glenn W. Brown
*Assistant Examiner*—Wasseem Hamdan
(74) *Attorney, Agent, or Firm*—Stephen A. Gratton

(57) ABSTRACT

A system for testing semiconductor components includes a testing apparatus, such as a test carrier for discrete components, or a wafer prober for wafer sized components The system also includes an interconnect for electrically engaging the components. The interconnect includes a thinned substrate, and first contacts on the substrate for electrically engaging second contacts on the components. The thinned substrate has a thickness that is substantially less than a thickness of the components being tested. The thinned substrate can flex upon application of a biasing force by the testing apparatus, permitting the first contacts to move in the z-direction to accommodate variations in the planarity of the second contacts.

16 Claims, 8 Drawing Sheets

U.S. PATENT DOCUMENTS

| | | |
|---|---|---|
| 5,849,435 | 12/1998 | Akram et al. . |
| 5,851,845 | 12/1998 | Wood et al. . |
| 5,869,974 | 2/1999 | Akram et al. . |
| 5,878,485 | 3/1999 | Wood et al. . |
| 5,931,685 | 8/1999 | Hembree et al. . |
| 5,946,553 | 8/1999 | Wood et al. . |
| 5,962,921 | 10/1999 | Farnworth et al. . |
| 6,015,749 | 1/2000 | Liu et al. . |
| 6,016,060 | 1/2000 | Akram et al. . |
| 6,020,624 | 2/2000 | Wood et al. . |
| 6,040,239 | 3/2000 | Akram et al. . |
| 6,060,891 | 5/2000 | Hembree et al. . |
| 6,068,669 | 5/2000 | Farnworth et al. . |
| 6,072,321 | 6/2000 | Akram et al. . |
| 6,077,723 | 6/2000 | Farnworth et al. . |
| 6,078,186 | 6/2000 | Hembree et al. . |
| 6,091,252 | 7/2000 | Akram et al. . |
| 6,103,613 | 8/2000 | Akram . |
| 6,107,122 | 8/2000 | Wood et al. . |
| 6,114,240 | 9/2000 | Akram et al. . |
| 6,127,736 | 10/2000 | Akram . |
| 6,130,148 | 10/2000 | Farnworth et al. . |
| 6,140,827 | 10/2000 | Wark . |
| 6,188,232 | 2/2001 | Akram et al. . |

SYSTEM FOR TESTING SEMICONDUCTOR COMPONENTS HAVING FLEXIBLE INTERCONNECT

CROSS REFERENCE TO RELATED APPLICATIONS

This application is a division of patent application Ser. No. 09/756,626 filed on Jan. 8, 2001, U.S. Pat. No. 6,242,931, which is a division of patent application Ser. No. 09/304,227 filed on May 3, 1999, U.S. Pat. No. 6,263,566.

FIELD OF THE INVENTION

This invention relates generally to semiconductor testing and specifically to an improved system and interconnect for electrically testing semiconductor components such as dice, packages, wafers, panels, boards, and electronic assemblies containing dice or packages.

BACKGROUND OF THE INVENTION

Different types of semiconductor components are tested following the fabrication process. Test systems have been developed for handling the components, and for applying test signals to the integrated circuits, and other electrical elements, contained on the components. For example, discrete semiconductor components, such as bare dice and chip scale packages, are tested at the die level using carriers designed to temporarily package one or more components. Semiconductor wafers containing multiple dice or multiple chip scale packages, are tested using wafer level systems, such as wafer probers. Other electronic assemblies containing semiconductor dice or packages, such as circuit boards, and field emission displays, are also tested following fabrication.

The components include terminal contacts which provide electrical connection points for applying the test signals. For example, bare dice and semiconductor wafers typically include bond pads which function as terminal contacts. Chip scale packages typically include solder balls, which function as terminal contacts. Electronic assemblies, such as circuit boards and field emission displays, can include test pads, which function as terminal contacts.

The test systems include an interconnect that makes the temporary electrical connections with the terminal contacts on the components. Depending on the system, the interconnect can be die sized, or wafer sized. U.S. Pat. No. 5,686,317 entitled "Method For Forming An Interconnect Having A Penetration Limited Contact Structure For Establishing A Temporary Electrical Connection With A Semiconductor Die", describes a die level interconnect configured for use with a carrier. U.S. Pat. No. 5,869,974 entitled "Micromachined Probe Card Having Compliant Contact Members For Testing Semiconductor Wafers", describes a wafer level interconnect configured for use with a wafer prober.

One material that can be used to fabricate interconnects is silicon. Silicon is used as a substrate material and also to form contacts for the interconnect. With silicon, a coefficient of thermal expansion (CTE) of the interconnect matches the CTE of the component. This minimizes thermal stresses during test procedures, such as burn-in, which are conducted at elevated temperatures.

One aspect of silicon is that it is a relatively rigid material that does not easily flex to accommodate differences in the planarity of the contacts on the components. Accordingly, silicon interconnects require relatively large biasing forces to permit the interconnect contacts to engage the component contacts. Often times the component, rather than the interconnect, will flex under the large forces applied during test procedures. However, in order to minimize the possibility of damage to components, it is preferable that the components not be overloaded, or stressed, during a test procedure.

Sometimes the interconnect contacts, are designed to flex to accommodate variations in the planarity, or z-direction location, of the terminal contacts on the components. However, this can make the interconnect more complicated and less reliable, and may require relatively complicated fabrication processes. The present invention is directed to an interconnect which is thinned to provide a flexible structure for engaging semiconductor components.

SUMMARY OF THE INVENTION

In accordance with the present invention, an improved system and interconnect for testing semiconductor components, and a method for fabricating the interconnect are provided. The interconnect comprises a thinned substrate, and a pattern of contacts on the substrate configured to electrically engage contacts on the components In illustrative embodiments the substrate comprises silicon, but alternately can comprise ceramic, plastic, another semiconductor material such as germanium, or a composite material such as silicon-on-glass, or silicon-on-sapphire.

The interconnect can be configured for die level testing of discrete components, such as bare dice or chip scale packages, or alternately for wafer level testing of multiple components contained on a common substrate, such as a wafer, a panel, a circuit board, or an electronic assembly. In addition, the interconnect contacts can be configured to electrically engage either planar component contacts (e.g., bond pads, test pads, land pads), or bumped component contacts (e.g., solder balls, metal bumps, conductive polymer bumps). For engaging planar contacts, the interconnect contacts comprise etched members with projections for penetrating the planar contacts to a limited penetration depth. For engaging bumped contacts, the interconnect contacts comprise projections configured to penetrate the bumped contacts, or alternately recesses sized and shaped to retain the bumped contacts.

The method for fabricating the interconnect includes the steps of: providing a substrate, forming interconnect contacts on a circuit side of the substrate, covering the circuit side with a protective mask, thinning a backside of the substrate, and then removing the protective mask. The mask protects the interconnect contacts during the thinning step. In addition, the mask provides a planar surface for mounting the interconnect to a chuck, or similar tool, for thinning. Prior to removing the mask, additional fabrication process steps such as via formation, metallization, and dicing can be performed on the interconnect while the mask remains in place. Also, rather than removing all of the protective mask following the fabrication process, selected portions of the mask can be removed while other portions remain. In this case, the remaining portions of the mask can be configured to provide permanent structures on the interconnect, such as alignment fences, support structures, insulating layers, protective layers, and molding dams.

The protective mask can comprise any protective material suitable for covering the interconnect contacts and providing a planar surface. Exemplary protective materials include curable polymers, such as epoxy and silicone. Alternately the protective material can comprise a film material, such as polyimide tape.

In an illustrative embodiment, the protective mask comprises a photoimageable polymer material, such as a thick film resist, which is blanket deposited on the substrate by spin on or other process, developed, planarized, if necessary, and then cured as required. The thinning step can be performed by chemically mechanically planarizing or grinding a backside of the substrate, or alternately by etching the backside of the substrate. During the thinning step, the protective mask protects the interconnect contacts, strengthens the substrate, and provides a planar surface for handling. Preferably, the fabrication process is performed on a wafer of material, which following removal of the protective mask, can be singulated into individual interconnects.

Following the fabrication process, the thinned interconnect can be mounted to a rigid substrate using a compliant polymer layer. During a test procedure using the interconnect, the thinned substrate can flex with the compliant layer upon application of a biasing force, while the component remains relatively planar. This flexibility permits the interconnect contacts to electrically engage the component contacts even with variations in the dimensions and planarity of the component contacts.

For a die level test system, the interconnect is configured for assembly in a testing apparatus, such as a carrier, configured to retain one or more components in electrical communication with testing circuitry. The testing apparatus includes a base on which the interconnect is mounted, and a force applying mechanism for biasing the components against the interconnect. For a wafer level test system, the interconnect is configured for use with a wafer testing apparatus such as a wafer prober. In the wafer level test system the interconnect can take the place of a conventional probe card.

DETAILED DESCRIPTION OF THE PREFERRED EMBODIMENTS

As used herein the term "semiconductor component" refers to an electrical element or assembly that contains a semiconductor die. Exemplary semiconductor components include bare semiconductor dice, chip scale packages, conventional semiconductor packages, wafers containing dice or chip scale packages, panels containing chip scale packages, boards containing semiconductor dice, and electronic assemblies, such as field emission displays, containing semiconductor dice.

Figure 1A:
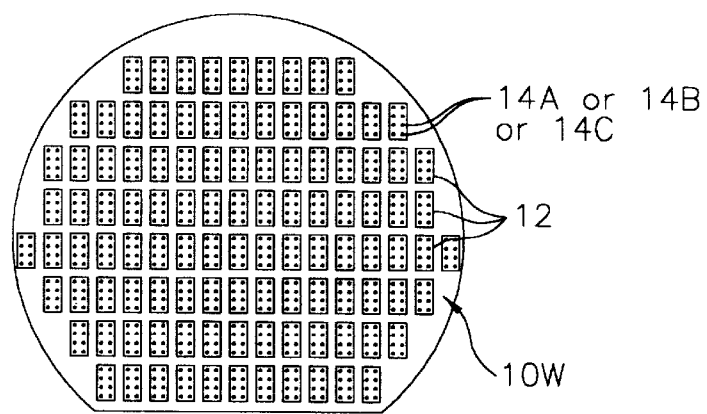
FIG. 1A is a schematic plan view of a wafer level interconnect constructed in accordance with the invention.

In FIG. 1A, a wafer level interconnect 10W is illustrated. The interconnect 10W is adapted to test wafer sized components such as semiconductor wafers. In the illustrative embodiment the interconnect 10W has the peripheral shape of a semiconductor wafer. However, depending on the components being tested, other peripheral shapes are possible. In addition, the interconnect 10W includes a plurality of test sites 12 corresponding to the location of the dice on the wafer. Again, the number and configuration of the test sites 12 will correspond to the components being tested.

Figure 1B:
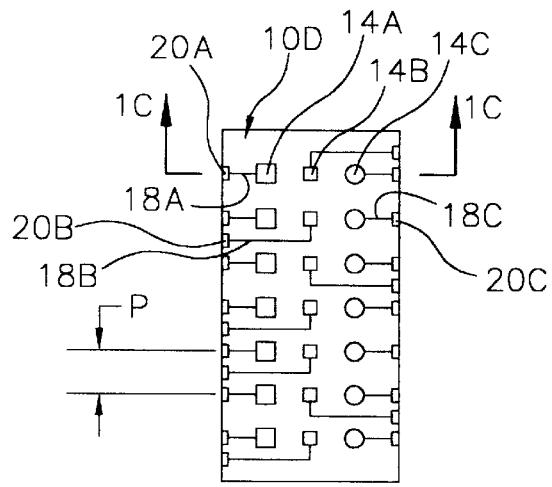
FIG. 1B is a schematic plan view of a die level interconnect constructed in accordance with the invention.

In FIG. 1B, a die level interconnect 10D is illustrated. The die level interconnect 10D is adapted to test discrete semiconductor components, such as singulated semiconductor dice, or chip scale packages. The die level interconnect 10D, and the wafer level interconnect 10W have the same basic construction, but different peripheral sizes and peripheral configurations. In general, each test site 12 on the wafer level interconnect 10W corresponds in size and shape to the die level interconnect 10D.

As shown in FIG. 1B, the interconnect 10D (or the interconnect 10W) includes a plurality of interconnect contacts 14A, 14B, 14C. For illustrative purposes three different types of interconnect contacts 14A, 14B, 14C are shown on the interconnect 10D. However, in actual practice the interconnect 10D (or the interconnect 10W) will include only one type of interconnect contact 14A, 14B, 14C. The interconnect 10D (or the interconnect 10W) also includes conductors 18A, 18B, 18C and bonding pads 20A, 20B, 20C in electrical communication with the interconnect contacts 14A, 14B, 14C.

Figure 1C:
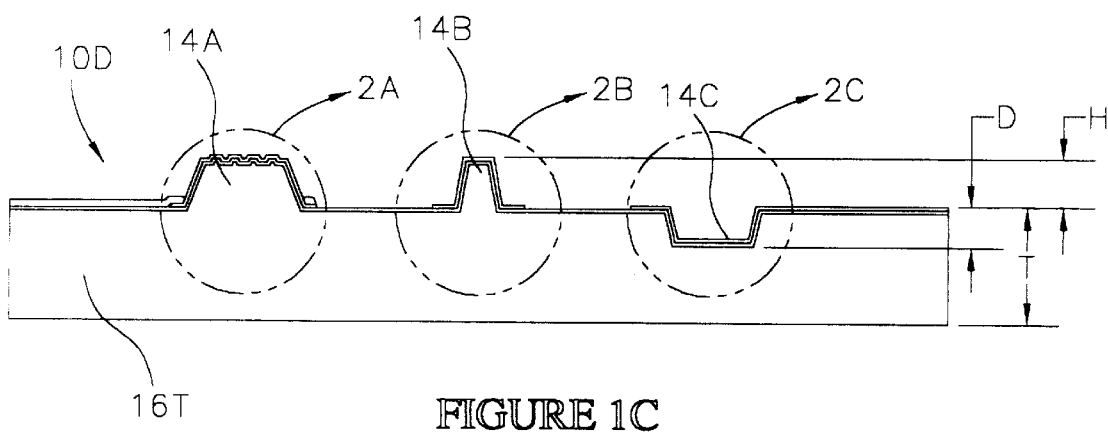
FIG. 1C is an enlarged schematic cross sectional view taken along section line 1C—1C of FIG. 1B.

As shown in FIG. 1C, the interconnect 10D (or the interconnect 10W) includes a thinned substrate 16T on which the interconnect contacts 14A, 14B, 14C, the conductors 18A, 18B, 18C and the bonding pads 20A, 20B, 20C are formed. As will be further explained the substrate 16T has a thickness that is substantially less than a thickness of a conventional semiconductor component such as a die, a wafer, or a chip scale package. Accordingly, during a test procedure using the interconnect 10D (or the interconnect 10W), the substrate 16T can flex to allow the interconnect contacts 14A, 14B, 14C to move in a z-direction to accommodate variations in the planarity of the contacts on the components.

Also in FIG. 1C, a height H of the interconnect contacts 14A, 14B relative to the thickness T of the substrate 16T is illustrated. By way of example and not limitation, the thickness T of the substrate 16T can be from about 0.004 inches (0.102 mm) to 0.014 inches (0.356 mm). A height H of the contacts 14A, 14B can be about 50 $\mu$m (0.050 mm) to 100 $\mu$m (0.10 mm). A depth D of the contacts 14C can be about 25 $\mu$m (0.025 mm) to 100 $\mu$m (0.10 mm). A pitch P (FIG. 1B) of the contacts 14A, 14B, 14C will exactly match a pitch of the contacts on the component. A representative pitch P (center to center spacing) of the contacts 14A, 14B, 14C can be from about 0.008 inches (0.228 mm) to about 0.060 inches (1.524 mm) or greater.

Figure 2A:
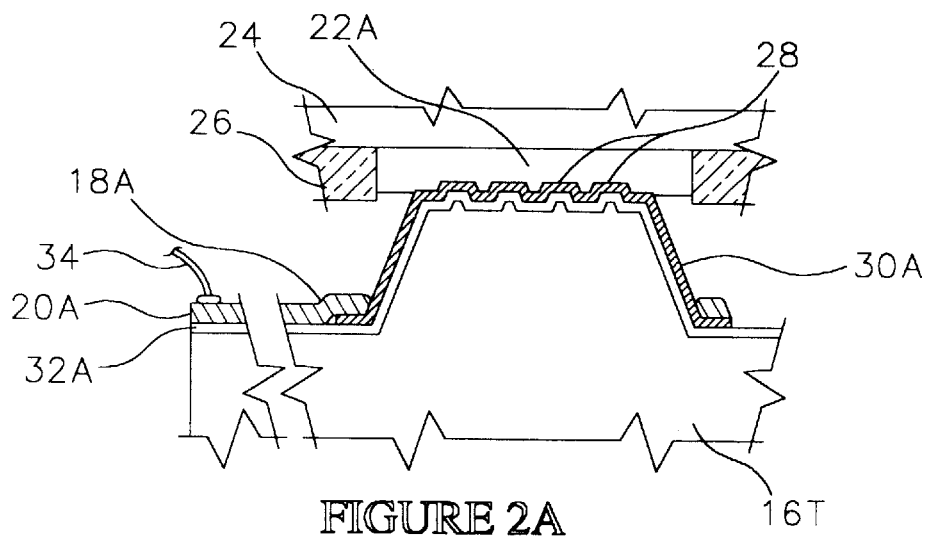
FIG. 2A is an enlarged cross sectional view taken along section line 2A of FIG. 1C illustrating a first interconnect contact electrically engaging a planar component contact.

Referring to FIG. 2A, the interconnect contact 14A is shown electrically engaging a planar contact 22A on a component 24. The planar contact 22A comprises a thin film bond pad formed of a material such as aluminum, embedded in a passivation layer 26, such as BPSG. Alternately, the interconnect contacts 14A can be configured to electrically engage other types of planar contacts, such as test pads, or land pads. Additionally, the interconnect contacts 14A can be configured to electrically engage thick film contacts rather than thin film contacts.

In the illustrative embodiment the substrate 16T comprises silicon, and the interconnect contacts 14A are raised members formed integrally with the substrate 16T using a fabrication process to be hereinafter described. With the substrate comprising silicon, a coefficient of thermal expansion (CTE) of the substrate 16T substantially matches that of semiconductor components such as bare dice and wafers. However, the substrate 16T can also comprise ceramic, plastic, silicon-on-glass, silicon-on-sapphire, or another semiconductor material such as gallium arsenide or germanium. The interconnect contacts 14A are formed in a pattern that matches a pattern of the planar contacts 22A on the component 24. In addition, the interconnect contacts 14A include penetrating projections 28 adapted to penetrate the planar contacts 22A to a limited penetration depth. With the planar contacts 22A comprising thin film bond pads, the penetration depth will be less than about 1 $\mu$m. Accordingly, the penetrating projections 28 can be formed with a height of less than about 1 $\mu$m.

As also shown in FIG. 2A, the interconnect contacts 14A include conductive layers 30A in electrical communication with the conductors 18A, and with the bonding pads 20A on the surface of the substrate 16T. The conductive layers 30A electrically engage the planar contacts 22A to provide conductive paths for applying test signals to the integrated circuits contained on the component 24. The conductive layers 30A and the conductors 18A can be formed of a conductive metal such as aluminum, chromium, titanium, nickel, iridium, copper, gold, tungsten, silver, platinum, palladium, tantalum, molybdenum or alloys of these metals such as TiSi$_2$. In addition, the conductive layers 30A and the conductors 18A can be formed as a single layer of metal, or as a multi metal stack, using a thin film metallization process (e.g., CVD, patterning, etching or electroplating) to be hereinafter described. Alternately, a thick film metallization process (e.g., screen printing, stenciling) can be used to form the conductive layers 30A and the conductors 18A.

Still referring to FIG. 2A, the substrate 16T also includes an insulating layer 32A adapted to electrically insulate the conductive layers 30A and the conductors 18A from a bulk of the substrate 16T. The insulating layer 32A can comprise a grown or deposited oxide such as SiO$_2$, or a polymer, such as polyimide. If the substrate 16T comprises an electrically insulating material such as ceramic, the insulating layer 32A is not required.

As also shown in FIG. 2A, the bonding pads 20A provide bonding sites for wire bonding bond wires 34. To facilitate wire bonding, the bonding pads 20A can comprise a wire bondable metal, such as copper or aluminum. The bond wires 34 provide separate electrical paths from test circuitry and a test apparatus to be hereinafter described. Alternately, the bonding pads 20A can be configured for bonding to TAB tape, or as contact sites for engagement by electrical connectors of the test apparatus. Further, the bonding pads 20A can be configured for electrical communication with conductive vias formed within the substrate 16T.

Suitable methods for forming the interconnect contacts 14A are described in U.S. Pat. No. 5,483,741, entitled "Method For Fabricating A Self Limiting Silicon Based Interconnect For Testing Bare Semiconductor Dice", and in U.S. Pat. No. 5,686,317 entitled "Method For Forming An Interconnect Having A Penetration Limited Contact Structure For Establishing A Temporary Electrical Connection With A Semiconductor Die" which are incorporated herein by reference.

Figure 2B:
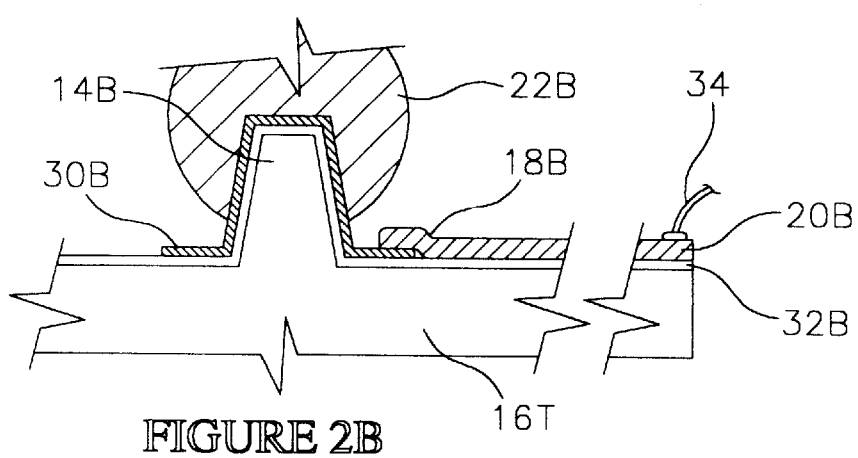
FIG. 2B is an enlarged cross sectional view taken along section line 2B of FIG. 1C illustrating a second interconnect contact electrically engaging a bumped component contact.

Referring to FIG. 2B, the interconnect contact 14B is shown electrically engaging a bumped contact 22B on the component. The bumped contact 22B comprises a solder ball, as is found on bumped dice and wafers, ball grid array packages, chip scale packages and other bumped components. Alternately the bumped contact 22B can have a hemispherical, bumped, or dome shape as is conventional. In addition, rather than solder the bumped contact 22B can comprise another metal, or a conductive polymer material. The interconnect contact 14B is adapted to penetrate into the bumped contact 22B and to contact the underlying metal. This allows native oxide layers to be penetrated for making low resistance temporary electrical connections.

The interconnect contact 14B comprises a projection on the substrate 16T which can be formed using an etching process to be hereinafter described. As with the interconnect contacts 14A, the interconnect contacts 14B are at least partially covered with conductive layers 30B. The conductive layers 30B are in electrical communication with conductors 18B and bonding pads 20B on the substrate 16T. In addition, an electrically insulating layer 32B electrically insulates the conductive layers 30B and conductors 18B from the substrate 16T.

Figure 2C:
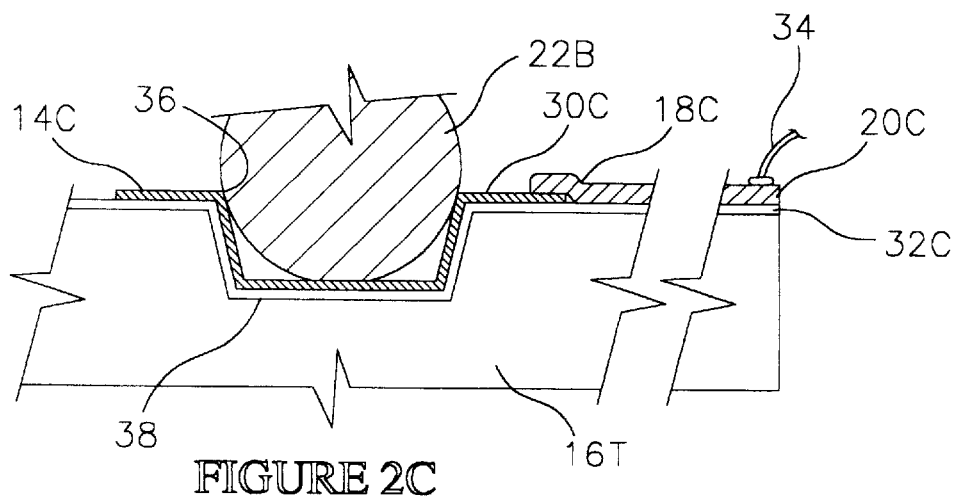
FIG. 2C is an enlarged cross sectional view taken along section line 2C of FIG. 1C illustrating a third interconnect contact electrically engaging a bumped component contact.

Referring to FIG. 2C, the interconnect contact 14C is shown electrically engaging the bumped contact 22B. The interconnect contact 14C comprises a recess 38 formed in the substrate 16T, that is sized and shaped to retain the bumped contact 22B. The interconnect contact 14C also includes a conductive layer 30C at least partially covering the recess 38. The conductive layer 30C is in electrical communication with a conductor 18C, and with a bonding pad 18C on the substrate 16T. Peripheral edges 36 of the conductive layer 30C are adapted to penetrate the bumped contact 22B to pierce native oxide layers and contact the underlying metal.

The conductive layers 30C, the conductors 18C and the bonding pads 20C can be made using semiconductor fabrication techniques (e.g., photolithography, etching, metallization) to be hereinafter described. Also with the substrate 16T comprising silicon, an electrically insulating layer 32C can be formed on exposed surfaces thereof to provide electrical insulation for the conductive layers 30, the conductors 18C and the bonding pads 20C, as previously described.

Preferably, the conductive layers 30C and the conductors 18C comprise a conductive metal such as aluminum, chromium, titanium, nickel, iridium, copper, gold, tungsten, silver, platinum, palladium, tantalum, molybdenum or alloys of these metals such as $TiSi_2$. As with the previously described conductive layers 30A (FIG. 2A), the conductive layers 30C and conductors 18C can be formed as a single layer of metal, or as a multi metal stack, using a thin film metallization process (e.g., CVD, patterning, etching or electroplating). Alternately, a thick film metallization process (e.g., screen printing, stenciling) can be used to form the conductive layers 30C and the conductors 18C.

The recesses 38 for the contacts 14C can be etched by forming a mask (not shown) on the substrate 16T, such as a photo patterned resist mask, and then etching the substrate 16T through openings in the mask, using an etchant. With the substrate 16T comprising silicon, a suitable etchant for performing the etch process comprises a solution of KOH.

A size and shape of the recesses 38 will be determined by the openings in the etch mask used to etch the substrate 16T. Each recess 38 is sized and shaped to retain and electrically engage a single bumped contact 22B. A representative diameter, or width, of the recesses 38 can be from 0.002 inches (0.051 mm) to 0.050 inches (1.27 mm) or more. This diameter can be less than a diameter of the bumped contacts 22B so that only portions thereof will be contacted. A depth of the recesses 38 can be equal to or less than the diameter thereof. A pitch or spacing of the recesses 38 will exactly match a pitch of the bumped contacts 22B.

Other types of contacts configured to make non-bonded, temporary electrical connections with bumped contacts 22B on semiconductor components are described in the following U.S. patent applications, which are incorporated herein by reference:

U.S. patent application Ser. No. 08/829,193, now U.S. Pat. No. 5,962,921, entitled "Interconnect Having Recessed Contact Members With Penetrating Blades For Testing Semiconductor Dice And Packages With Contact Bumps";

U.S. patent application Ser. No. 08/823,490, now U.S. Pat. No. 6,016,060, entitled "Method, Apparatus And System For Testing Bumped Semiconductor Components"; and U.S. patent application Ser. No. 08/867,551, now U.S. Pat. No. 5,931,685, entitled "Interconnect For Making Temporary Electrical Connections With Bumped Semiconductor Components". Referring to FIGS. 3A–3G, steps in a method for fabricating the interconnect 10W (FIG. 1A) or the interconnect 10D (FIG. 1B) are illustrated. In FIGS. 3A–3G, the different interconnect contacts 14A, 14B, 14C are illustrated as being formed at the same time on the same substrate 16, However, in actual practice only one type of contact 14A, 14B, 14C will be formed on an interconnect 10W or 10D.

Initially, a substrate 16 can be provided. The substrate 16 includes a circuit side 50 and a backside 52. Preferably the substrate 16 comprises a wafer of material such that a wafer level fabrication process can be employed to make either interconnect 10W or interconnect 10D. In the case of the wafer level interconnect 10W (FIG. 1A), the substrate 16 can be the same size and peripheral configuration as the completed interconnect 10W. In the case of the die level interconnect 10D (FIG. 1B), a singulation process, such as cutting or shearing, can be used to separate multiple interconnects 10D from the substrate 16. The separated interconnects 10D (FIG. 1B) will then have a peripheral shape corresponding to the component being tested. In the illustrative embodiment the substrate 16 comprises monocrystalline silicon. A thickness T1 of the substrate 16 can be that of a conventional silicon wafer blank. A representative thickness T1 of the substrate 16 can be about 0.028 inches (0.712 mm) or greater. A representative diameter of the substrate 16 can be about 200 mm.

Figure 3A:
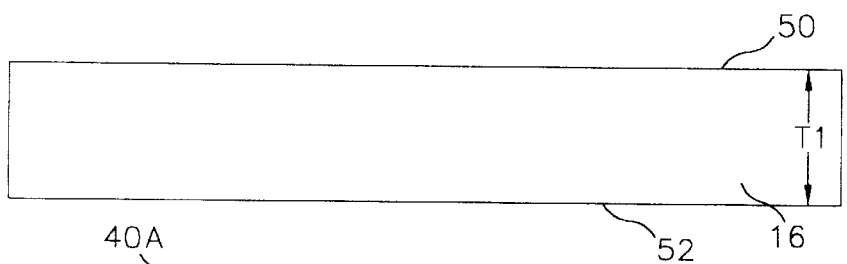
FIGS. 3A–3G are schematic cross sectional views illustrating process steps for fabricating an interconnect in accordance with the invention.
Figure 3B:
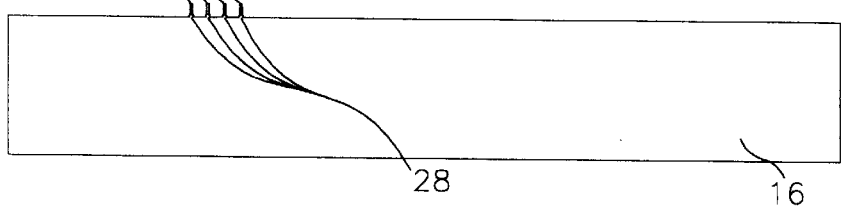

Next, as shown in FIG. 3B, a first mask 40 can be formed on the substrate 16 and used to etch the penetrating projections 28 for contact 14A. The first mask 40 can comprise resist, or a hard mask such as $Si_3N_4$. In addition, a wet etchant, such as KOH, can be used to etch the substrate 16 to form the penetrating projections 28. A representative height of the penetrating projections can be from 0.25 μm to 1.0 μm.

Figure 3C:
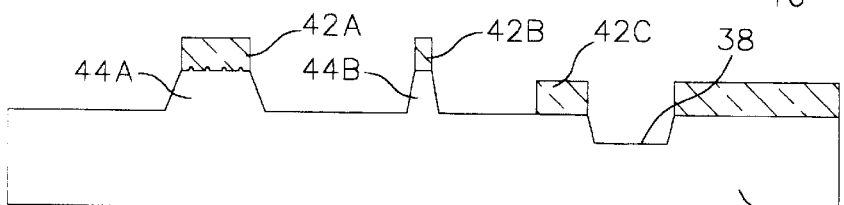

Next, as shown in FIG. 3C, a second mask 42A can be formed on the substrate 16 for etching a projection 44A for contact 14A. A representative height of the projection 44A can be about 25 μm to 100 μm and a representative width can be about 25 μm to 50 μm on a side. Similarly a mask 42B can be formed on the substrate 16 for etching a projection 44B for contacts 14B. The projection 44B can be sized similarly to projection 44A. Similarly a mask 42C can be formed on the substrate 16 for etching the recess 38 for contacts 14C. The recess 38 can be sized as previously described. The masks 42A, 42B, 42C can comprise hard masks or resist masks. In addition, a wet etchant such a KOH can be employed to anisotropically etch the substrate 16. Alternately an isotropic etch process with a wet etchant such as $HF/HNO_3$ can be employed.

Figure 3D:
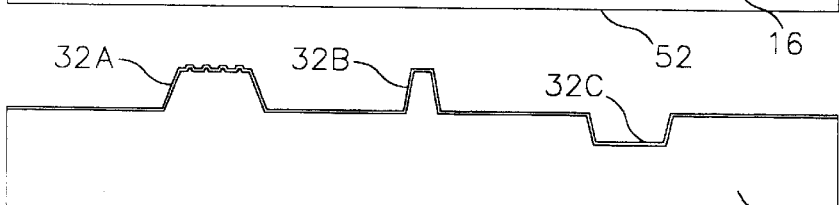

Next, as shown in FIG. 3D, the insulating layers 32A, 32B, 32C can be formed. The insulating layers 32A, 32B, 32C can comprise an electrically insulating material, such as U.S. patent application Ser. No. 08/829,193, now U.S. Pat. No. 5,962,921, entitled "Interconnect Having Recessed Contact Members With Penetrating Blades For Testing Semiconductor Dice And Packages With Contact Bumps";

U.S. patent application Ser. No. 08/823,490, now U.S. Pat. No. 6,016,060, entitled "Method, Apparatus And System For Testing Bumped Semiconductor Components"; and U.S. patent application Ser. No. 08/867,551, now U.S. Pat. No. 5,931,685, entitled "Interconnect For Making Temporary Electrical Connections With Bumped Semiconductor Components". $SiO_2$, or $Si_3N_4$, deposited to a desired thickness using CVD, or other deposition process. A $SiO_2$ layer can also be grown on exposed surfaces of the substrate 16 using an oxidizing atmosphere such as steam and $O_2$ at an elevated temperature (e.g., 950° C.). The insulating layers 32A, 32B, 32C can also comprise a polymer, such as polyimide, deposited and planarized using a suitable process (e.g., spin-on-process). Depending on the material, a representative thickness of the insulating layers 32A, 32B, 32C can be from about a 100 Å to several mils.

Figure 3E:
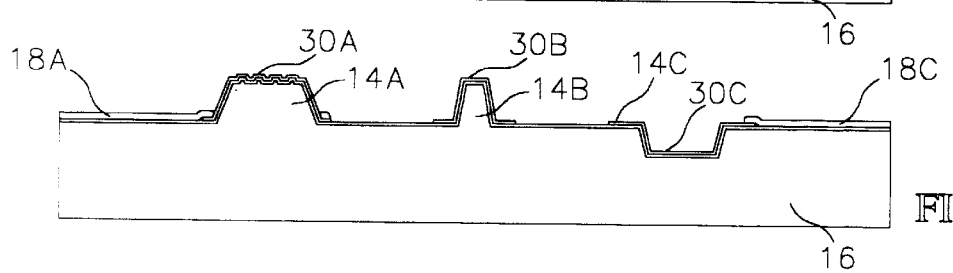

Next, as shown in FIG. 3E, the conductive layers 30A, 30B, 30C can be formed on the projections 44A, 44B or on the recess 38. The conductive layers 30A, 30B, 30C can comprise a thin film metal deposited to a thickness of several hundred Å or more using a process such as CVD. The conductors 18A, 18B, 18C and bonding pads 20A, 20B, 20C (FIG. 1B) can be formed at the same time as the conductive layers 30A, 30B, 30C or can be formed using a separate metallization process.

The conductive layers 30A, 30B, 30C and conductors 18A, 18B, 18C can comprise a patterned layer of a conductive metal such as aluminum, chromium, titanium, nickel, iridium, copper, gold, tungsten, silver, platinum, palladium, tantalum, molybdenum or alloys of these metals such as $TiSi_2$. Rather than being a single layer of metal, the he conductive layers 30A, 30B, 30C and conductors 18A, 18B, 18C can comprise multi-layered stacks of metals (e.g., bonding layer/barrier layer). The bonding pads 20A, 20B, 20C can be formed using a same process as the conductors 18A, 18B, 18C, or can be formed separately.

Figure 3F:
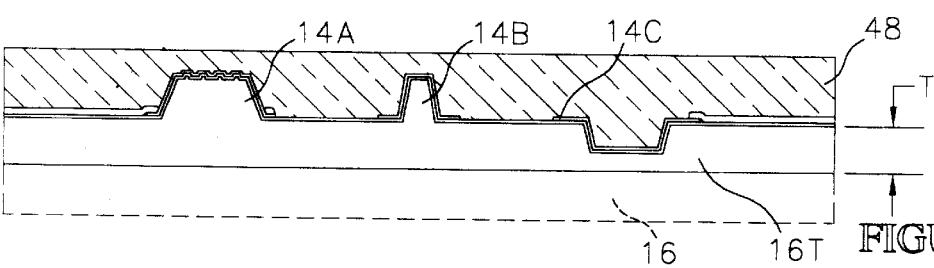

Next, as shown in FIG. 3F a protective mask 48 is formed on the circuit side 50 of the substrate 16. The protective mask 48 will protect the interconnect contacts 14A, 14B, 14C, the conductors 18A, 18B, 18C, and the bonding pads 20A, 20B, 20C during backside thinning of the substrate 16. In addition, the protective mask 48 strengthens the substrate 16 during the thinning step.

The protective mask 48 can comprise any suitable material that can be deposited in a thickness sufficient to cover the interconnect contacts 14A, 14B, 14C and provide a planar surface. One suitable material for the protective mask 48 comprises a curable polymer such as epoxy, silicone, polyimide, or thick film resist having a thickness sufficient to completely cover the contacts 14A, 14B, 14C. Alternately the protective mask 48 can comprise a film material such as a polyimide tape, which can be deposited in one or more layers to cover the contacts 14A, 14B, 14C.

One suitable curable polymer for forming the protective mask 48 comprises a thick film resist sold by Shell Chemical under the trademark "EPON RESIN SU-8". The resist can be deposited in layers to a thickness of from about 3–50 mils. The resist also includes an organic solvent (e.g., gammabutyloracton), and a photoinitiator. A conventional resist coating apparatus, such as a spin coater, or a meniscus coater, along with a mask or stencil, can be used to deposit the resist in viscous form onto the circuit side 50 of the substrate 16. The deposited resist can then be partially hardened by heating to about 95° C. for about 15 minutes or longer. If desired, the deposited resist can be exposed and developed prior to further hardening such that only selected portions of the substrate 16 will be covered. In addition, as will be further explained selected portions of the deposited resist can remain on the substrate 16 to form permanent structures.

Exposure of the protective mask 48 can be with a conventional UV mask writer using a suitable UV dose. A representative UV dose for the previously described resist formulation is about 165 mJ/$cm^2$. A suitable wet etchant for etching (i.e., developing) the resist is a solution of PGMEA (propyleneglycol-monomethylether-acetate). Following development the resist can be fully hardened. A "full cure" can be performed with a hard bake at about 200° C. for about 30 minutes. In addition, the protective mask can be planarized if required using a suitable process such as grinding or chemical mechanical planarization.

As also shown in FIG. 3F, with the protective mask 48 in place on the circuit side 50, a thinning step is performed on a backside 52 of the substrate 16. One method for performing the thinning step is by chemical mechanical planarization (CMP). Suitable CMP apparatuses for performing the thinning step are available from Westech Engineering. One suitable model is designated a Model 372 Polisher. The CMP apparatus includes a rotating polishing head for holding the substrate 16 and a rotatable polishing pad for contacting the exposed backside 52 of the substrate 16.

With such a CMP apparatus the substrate 16 is held against the polishing pad with a controlled pressure. The planar surface provided by the protective mask 48 allows the substrate 16 to be held by the polishing head. A chemical slurry is metered onto the polishing pad to provide chemical etchants and an abrasive medium such as silica particles suspended in a solution. Process conditions such as rotational speeds, force, temperature, and slurry composition can be controlled to remove material from the backside 52 of the substrate 16 at a desired rate (e.g., 100 Å to 4000 Å per minute). Suitable polishing pads for performing the thinning step can be obtained from Rodel Products Corporation. An exemplary polishing pad is designated a "POLYTEX SUPREME".

Representative process conditions during the thinning step include: a polishing pressure of 1 psi to 7 psi; a silica based slurry; a slurry rate of 20–200 milliliters per minute; an RPM of 5 to 50: and a "POLYTEX SUPREME" polishing pad. Following the thinning step the thinned substrate 16T has a thickness of T. A representative range for the thickness T can be from about 0.002 inches (0.051 mm) to 0.014 inches (0.356 mm).

Rather than performing the thinning step by CMP an etch process can be employed. In this case, a wet etchant is applied to the backside 52 of the substrate 16. For thinning by wet etching, an etchant solution containing a mixture of KOH (Potassium Hydroxide) and $H_2O$ can be utilized. A one to one solution at a temperature of about 60° to 80° C. will etch monocrystalline silicon at an etch rate of about 300 to 800 Å/min. Another wet etching process can be performed using an isotropic etch of $HNO_3$ and HF produces an etch rate of 55–60 $\mu$m/min. A dry etch process with an etchant such as a species of chlorine can also be utilized. In this case, the etch rate will be much slower than specified above.

The thinning step can also be performed using a conventional back grinding apparatus. In this case the substrate 16 can be held in a chuck, or other holding mechanism, and a rotating wheel can be used to back grind the backside of the substrate 16.

Following performance of the thinning step, the protective mask 48 can be stripped. A suitable wet etchant for stripping the previously described resist formulation is a solution of PGMEA (propyleneglycol-monomethylether-acetate). However, prior to stripping the protective mask 48, other fabrication process can be performed, as required, on the interconnect 16, or on the thinned interconnect 16T. For example, the protective mask 48 can remain in place during conductive via formation, backside metallization, and dicing steps.

Figure 3G:
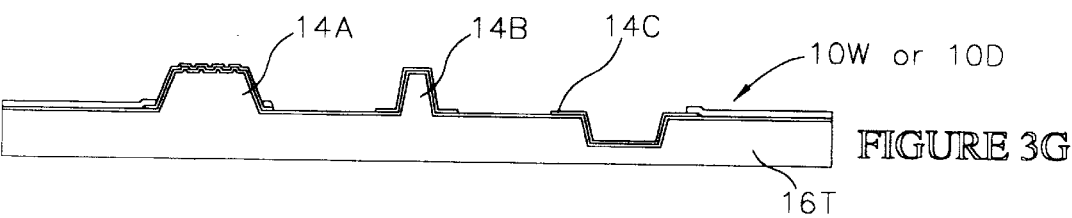

FIG. 3G shows the completed interconnect 10W or 10D and the contacts 14A, 14B, 14C on the thinned substrate 16T.

Figure 3H:
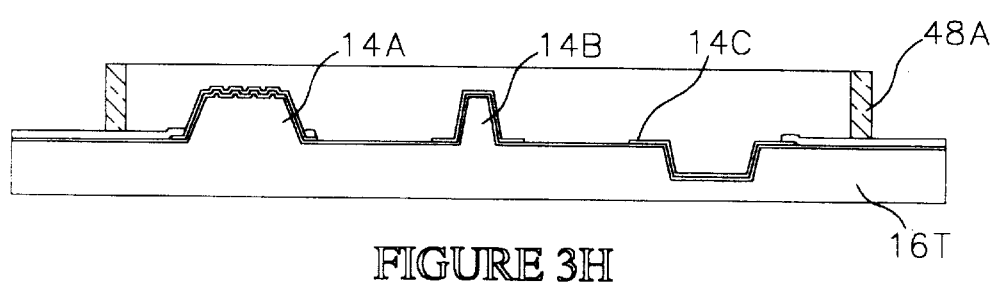
FIG. 3H is a schematic cross sectional view illustrating an optional process step wherein a portion of a protective mask is configured as a permanent structure for the interconnect.

Referring to FIG. 3H, as an optional step, the protective mask 48 can be developed, or etched, to form a permanent structure 48A for the interconnect 16T. In the illustrative embodiment the permanent structure 48A comprises an alignment fence, or a support structure for an alignment fence. Alternately other permanent structures such as molding dams, insulating layers, and protective layers can be provided by patterning selected portions of the protective mask 48.

Figure 3I:
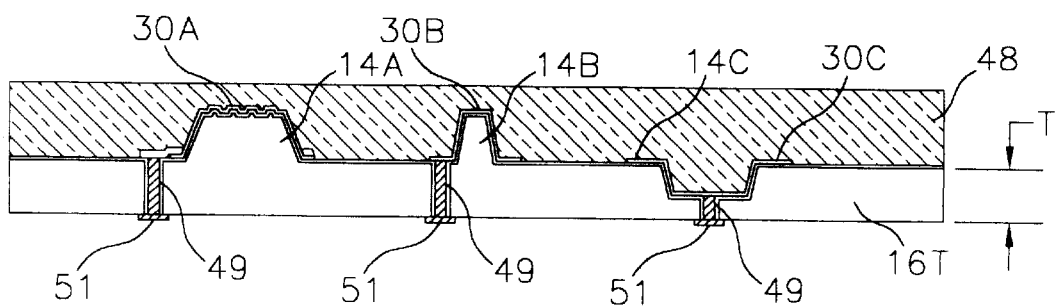
FIG. 3I is a schematic cross sectional view illustrating another optional process step wherein conductive vias are formed in the thinned substrate;.

Referring to FIG. 3I, as another option, prior to removing the protective mask 48, additional process steps can be performed on the substrate 16, or on the thinned substrate 16T. In FIG. 3I, conductive vias 49 and backside contacts 51 are formed in the thinned substrate 16T. The conductive vias 49 comprise openings filled with a conductive material in electrical communication with the conductive layers 30A, 30B, 30C. One method for forming the openings for the conductive vias 49 is with a laser machining process. A suitable laser machining apparatus is manufactured by General Scanning of Sommerville, MA and is designated a Model No. 670-W. Another suitable laser machining apparatus is manufactured by Synova S. A., Lausanne, Switzerland. To complete the conductive vias 49, a metal can be deposited within the openings using a deposition process, such as CVD, electrolytic deposition or electroless deposition. Alternately, rather than being a metal, the conductive material for the conductive vias 49 can comprise a conductive polymer, such as a metal filled silicone, a carbon filled ink, or an isotropic or anisotropic adhesive.

At the same time the conductive material is deposited in the openings to form the conductive vias 49, the backside contacts 51 can be formed on the substrate 16T. A suitable mask (not shown) can be used during deposition of the conductive material to form the backside contacts 51 with a desired thickness and peripheral shape. Alternately, the backside contacts 51 can comprise a different material than the conductive vias 49 formed using a separate deposition or metallization process. For example, the backside contacts 51 can comprise a wire bondable or solderable metal, such as copper or aluminum, while the conductive vias 49 can comprise a material such as nickel.

Figure 4A:
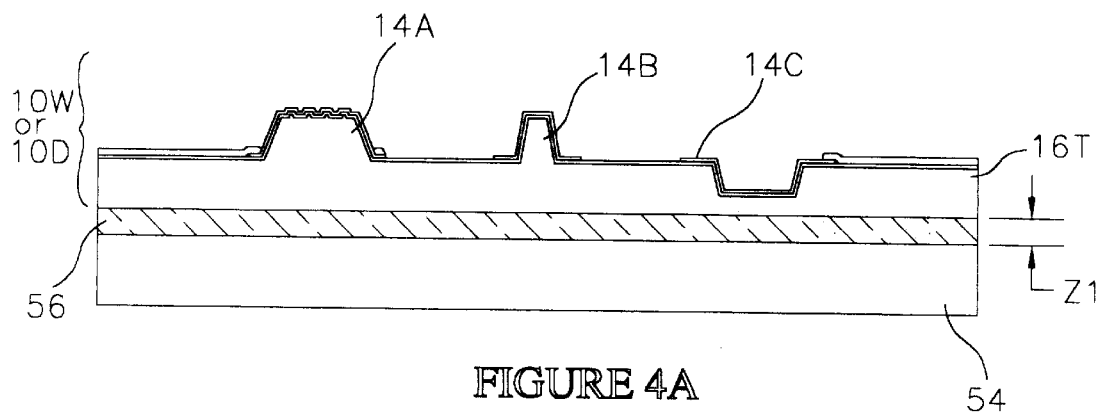
FIG. 4A is a schematic cross sectional view of the interconnect mounted to a rigid substrate on a compliant layer.

Referring to FIG. 4A, for performing test procedures, the interconnect 10W or 10D can be mounted to a rigid substrate 54 using a compliant layer 56. Suitable materials for the rigid substrate 54 include ceramic, plastic and silicon. Suitable materials for the compliant layer 56 include polymers such as silicone, flourosilicone, polyimide butyl rubber, elastomeric adhesives and die attach adhesives. For example, the compliant layer 56 can comprise a polymer deposited in viscous form and then cured. One suitable adhesive is "ZYMET", silicone elastomer manufactured by Zymet, Inc. East Hanover N.J. Alternately, the compliant layer 56 can comprise a polymer tape such as "KAPTON" tape having one or more adhesive surfaces. A representative thickness Z1 for the compliant. layer 56 can be from about 0.005 inches (0.127 mm) to 0.030 inches (0.762 mm).

Figure 4B:
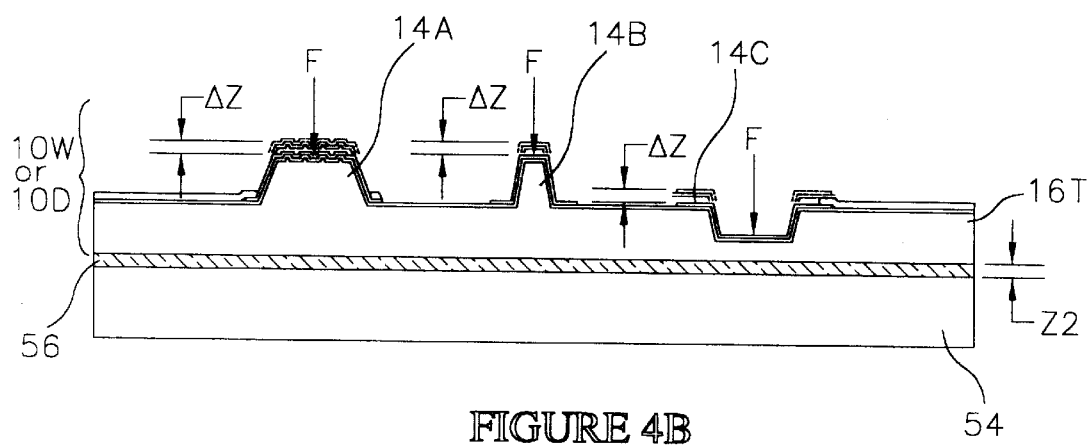
FIG. 4B is a schematic cross sectional view of the interconnect during loading and flexing of the contacts in the z-direction.

As shown in FIG. 4B, during a test procedure a biasing force F can be applied for biasing the interconnect 10W or 10D against the planar contacts 22A (FIG. 2A), or bumped contacts 22B (FIG. 2B) on the component 24 (FIG. 2A). As will be further explained, the biasing force is generated by a test apparatus on which the interconnect 10W or 10D is mounted. During biasing, the compliant layer 56 compresses from a thickness of Z1 (FIG. 4A) to a thickness of Z2 (FIG. 4B). Because the thinned substrate 16T is flexible, the contacts 14A, 14B, 14C can move in the z-direction over a distance of Z. By way of example, and not limitation, for applications in which bare semiconductor dice are tested for certification as known good dice (KGD), a representative range for Z can be from 0.1 μm to 10 μm.

In addition, different contacts 14A, 14B, 14C on the thinned substrate 16T can move independently of one another. This allows the z-direction location of the contacts 14A, 14B, 14C to adjust to the location of the contacts 22A or 22B on the components. Also, since the interconnect 10W or 10D is thinner than the component, the biasing force can be adjusted such that the component does not bend or flex.

Figure 4C:
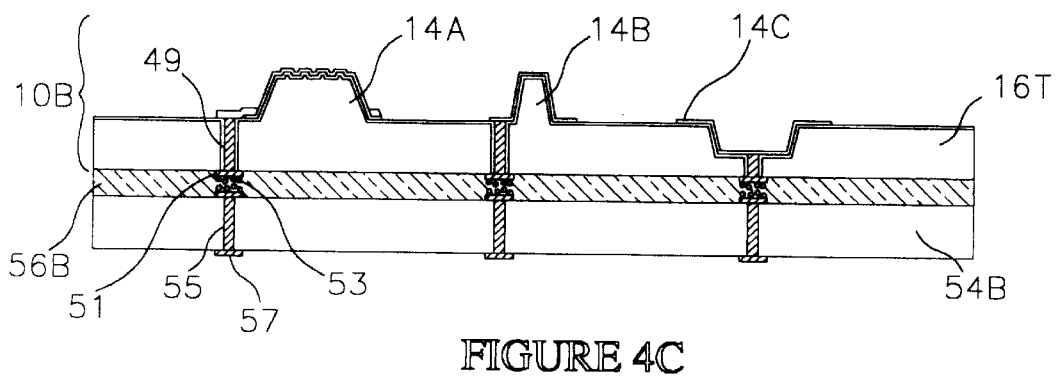
FIG. 4G is a schematic cross sectional view of an alternate embodiment interconnect mounted to a rigid substrate and wherein an electrical path is provided through the compliant Layer.

Referring to FIG. 4C the mounting of an alternate embodiment interconnect 10B is illustrated. The interconnect 10B includes conductive vias 49 and backside contacts 51 formed as shown in FIG. 3I. In addition, a rigid substrate 54B includes conductive vias 55 and backside contacts 57 that can also be formed as previously described. A compliant layer 56B attaches the interconnect 10B to the substrate 54B and functions to allow the contacts 14A, 14B, 14B to move in the z-direction as previously described. However, in this embodiment, the compliant layer 56B includes conductive particles 53 that form separate electrical paths between the backside contacts 51 on the interconnect 10B, and the conductive vias 55 on the substrate 54B. The compliant layer 56B can comprise a conductive polymer, such as an anisotropic adhesive, that contains the conductive particles 53. Alternately, rather than conductive particles 53, the compliant layer 56B can include wires or conductive vias that complete the electrical paths through the compliant layer 56B.

Figure 5A:
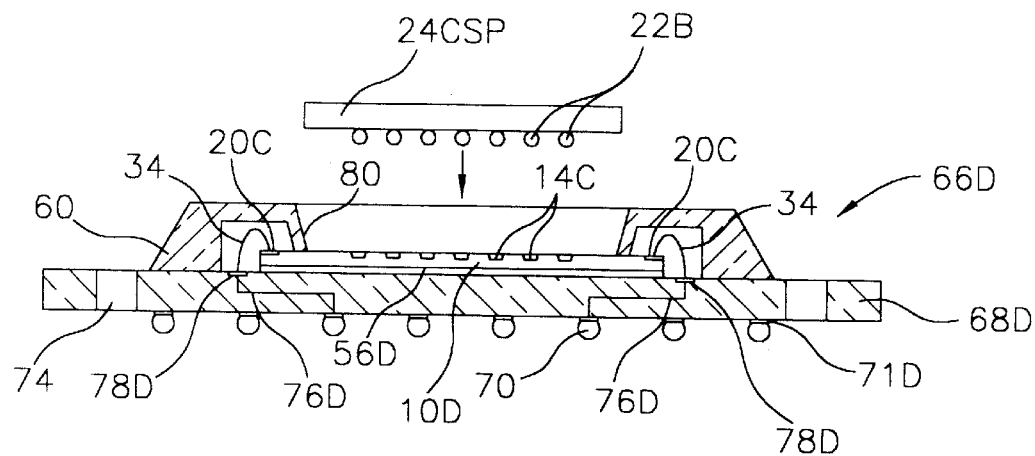
FIG. 5A is a schematic cross sectional view with parts removed of a die level testing apparatus constructed in accordance with the invention.
Figure 5B:
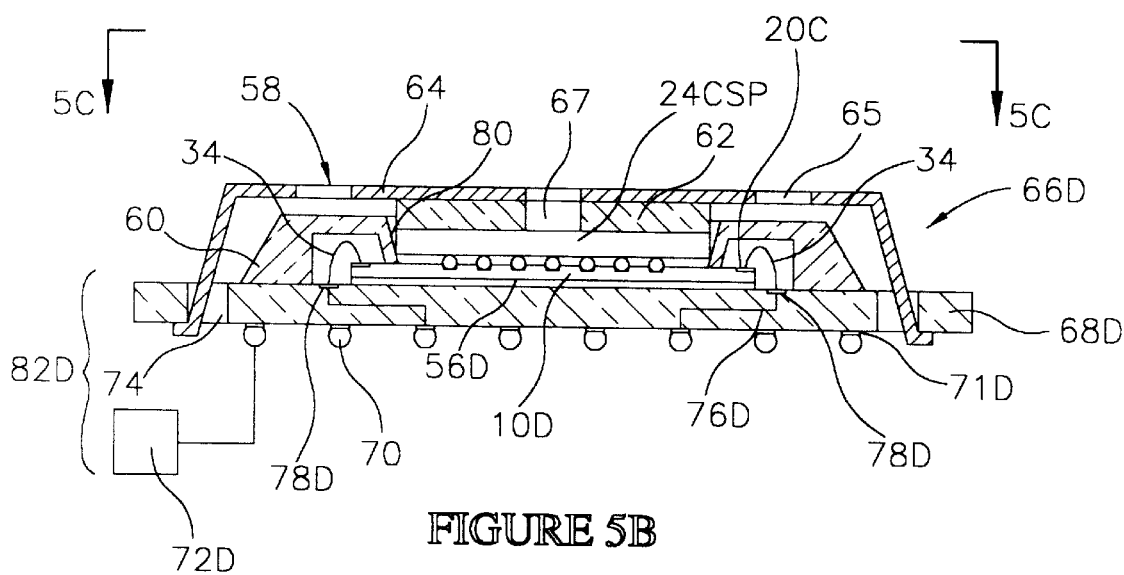
FIG. 5B is a schematic cross sectional view of the assembled testing apparatus and a test system incorporating the testing apparatus.
Figure 5C:
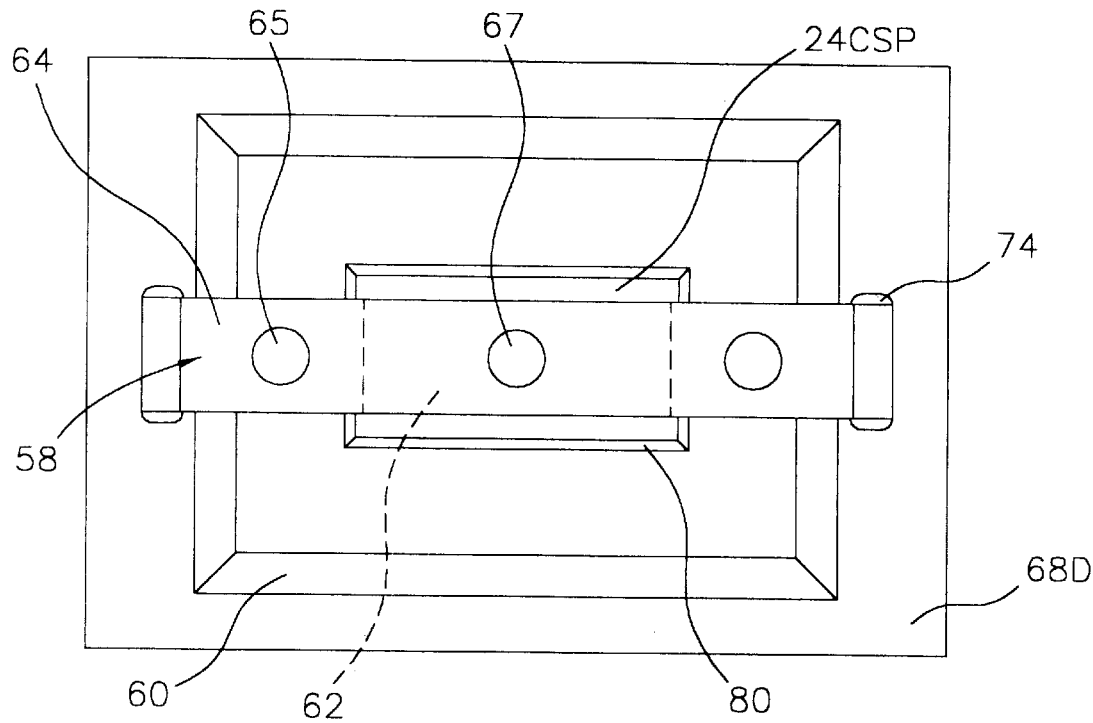
FIG. 5C is a plan view taken along section line 5C—5C of FIG. 5B.

Referring to FIGS. 5A–5C, a testing apparatus 66D incorporating the die level interconnect 10D is illustrated. The testing apparatus 66D is adapted to test a discrete component 24CSP, such as a chip scale package, or an unpackaged die, having bumped contacts 22B formed in a dense array, such as a ball grid array. The interconnect 10D includes contacts 14C, formed substantially as previously described, and configured to electrically engage the bumped contacts 22B on the component 24CSP.

The testing apparatus 66D includes a base 68D, and the interconnect 10D mounted to the base 68D. As shown in FIG. 5B, the testing apparatus 66D also includes an alignment member 60 for aligning the component 24CSP to the interconnect 10D, and a force applying mechanism 58 for biasing the component 24CSP against the interconnect 10D.

The base 68D comprises a rigid material such as ceramic, plastic or a glass filled resin. In this embodiment the base 68D functions similarly to the rigid substrate 54 (FIG. 4A) previously described. The base 68D includes external contacts 70 configured for electrical communication with testing circuitry 72D (FIG. 5B). In the illustrative embodiment, the external contacts 70 comprise metal balls attached to land pads 71D formed on the base 68D. The external contacts 70 and land pads 71D can be formed as described in U.S. Pat. No. 5,783,461 entitled "Temporary Semiconductor Package Having Hard-Metal, Dense-Array Ball Contacts And Method Of Fabrication", which is incorporated herein by reference.

The testing circuitry 72D generates test signals, and transmits the test signals to the external contacts 70, and through the interconnect 10D to the component 24CSP. The testing circuitry 72D also analyzes the resultant test signals transmitted from the component 24CSP. The testing apparatus 66D and testing circuitry 72D form a test system 82D (FIG. 5B) which permits various electrical characteristics of the component 24CSP to be evaluated.

The base 68D also includes openings 74 for attaching the force applying mechanism 58. In addition, the base 68D includes internal conductors 76D in electrical communication with the land pads 71D, and bond pads 78D formed on a surface thereof. The base 68D, internal conductors 76D, bond pads 78D and land pads 71D can be constructed using a ceramic lamination process, or a 3-D molding process as described in U.S. Pat. No. 5,878,485 entitled "Method For Fabricating A Carrier For Testing Unpackaged Semiconductor Dice".

The interconnect 10D is attached to the base 68D using a compliant layer 56D. The compliant layer 56D comprises a compliant polymer, such as a silicone adhesive or a tape, and functions substantially as previously described for compliant layer 56 (FIG. 4A). In addition, wires 34 are wire bonded to the bond pads 78D on the base 68D and to the bond pads 20C on the interconnect 10D. The external contacts 70 on the base 68D are thus in electrical communication with the contacts 14C on the interconnect 10D.

As shown in FIG. 5SB, the force applying mechanism comprises a clamp 64 that attaches to the base 68D, and a biasing member 62 for biasing the component 24CSP against the interconnect 10D. The clamp 64 can comprise a resilient material such as metal, and can be formed substantially as described in the above cited U.S. Pat. No. 5,878, 485.

The biasing member 62 can comprise an elastomeric polymer such as silicone, butyl rubber, or fluorosilicone. A representative hardness for the biasing member 62 can be from about 30–90 (Shore A), with and preferably about 60–70 (Shore A). Preferably, the biasing member 62 has a peripheral shape that matches the peripheral shape of the component 24CSP. In addition, the biasing member 62 is dimensioned to compress by a desired amount as the clamp 64 is attached to the base 68D. The amount of biasing force exerted by the biasing member 62 will be proportional to the amount of compression, and the characteristics of the material that forms the biasing member 62. If desired, the biasing member 62 can be secured to the clamp 64 using an adhesive.

Rather than being formed of an elastomeric polymer, the biasing member 62 can be formed of metal shaped to form a spring member. As another alternative the biasing member 62 can comprise a compressible gas or liquid filled bladder. Different types of bladders are commercially available from Paratech of Frankfort, Ill. under the trademark "MAXI FORCE AIR BAG".

The alignment member 60 includes an alignment opening 80 configured to contact the peripheral edges of the component 24CSP to align the bumped contacts 22B on the component 24CSP, to the contacts 14C on the interconnect 10D. The alignment member 60 can comprise a separate member formed of a rigid material such as silicon or plastic and then attached to the base 68D with an adhesive layer. Alternately, the alignment member 60 can comprise a deposited and cured polymer such as the previously described thick film resist used for fabricating the protective mask 48 (FIG. 3F). A suitable method for fabricating the alignment member 60 is described in U.S. Pat. No. 5,559,444, entitled "Method And Apparatus For Testing Unpackaged Semiconductor Dice", incorporated herein by reference.

Alternately the alignment member 60 can be eliminated and alignment of the component 24CSP to the interconnect 10D can be accomplished using optical alignment techniques. U.S. Pat. No. 5,634,267 entitled "Method And Apparatus For Manufacturing Known Good Semiconductor Die", which is incorporated herein by reference, describes suitable optical alignment techniques. In addition, the clamp 64 can include openings 65 (FIG. 5C), and the clamp 64 and biasing member 62 can include openings 67 (FIG. 5C), that allow manipulation of the force applying mechanism 58, and the component 24CSP by an automated assembly apparatus as described in the above cited '267 patent.

In the assembled test apparatus 66D, the interconnect 10D is able to flex substantially as previously described to accommodate variations in the planarity of the bumped contacts 22B. In addition, the biasing force exerted by the biasing member 62 can be adjusted such that the interconnect 10D flexes while the component 24CSP remains substantially planar.

Figure 6A:
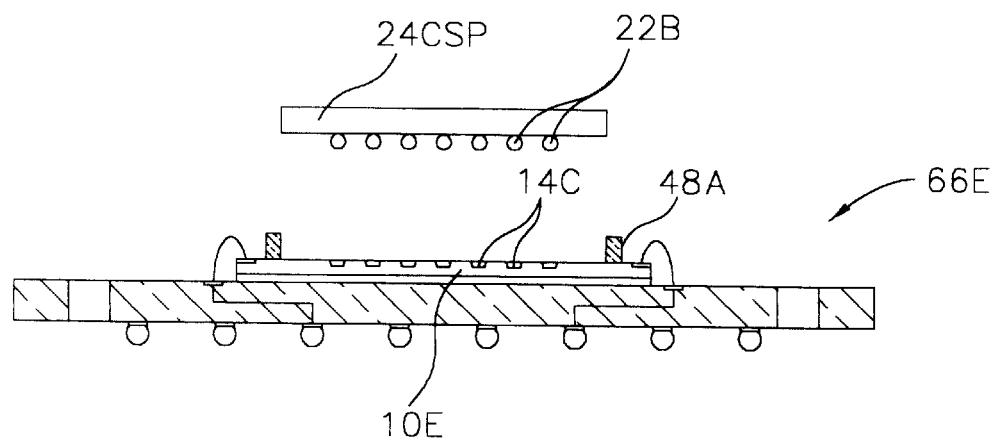
FIG. 6A is a schematic cross sectional view equivalent to FIG. 5A of an alternate embodiment testing apparatus having an interconnect with an alignment member formed by a portion of the protective mask.

Referring to FIG. 6A an alternate embodiment testing apparatus 66E is illustrated. The testing apparatus 66E is substantially equivalent to the testing apparatus 66D (FIG. 5A) previously described. However, the testing apparatus 66E includes interconnect 10E having the permanent structure 48A which is formed as shown in FIG. 3H. The permanent structure 48A is configured as an alignment member for aligning the component 24CSP to the interconnect 10E. Specifically the permanent structure 48A is configured to contact the peripheral edges of the component 24CSP such that the bumped contacts 22B align with the contacts 14C on the interconnect 10E.

Figure 6B:
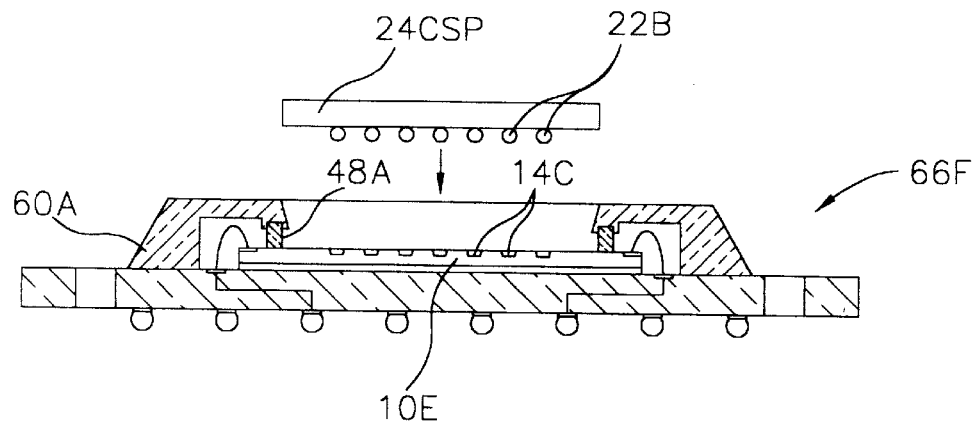
FIG. 6B is a schematic cross sectional view equivalent to FIG. 5A of an alternate embodiment testing apparatus having an interconnect with an alignment member supported by a portion of the protective mask.

Referring to FIG. 6B, an alternate embodiment testing apparatus 66F is illustrated. The testing apparatus 66F is substantially equivalent to the testing apparatus 66D (FIG. 5A) previously described. However, the testing apparatus 66F includes interconnect 10E having the permanent structure 48A, which is formed substantially as shown in FIG. 3H. The permanent structure 48A is configured as a support structure for an alignment member 60A. The alignment member 60A is substantially equivalent to the alignment member 60 (FIG. 5A) previously described. Because the permanent structure 48A can be accurately aligned to the interconnect 10E during the fabrication process, alignment of the alignment member 60A to the interconnect 10E is facilitated.

Figure 7:
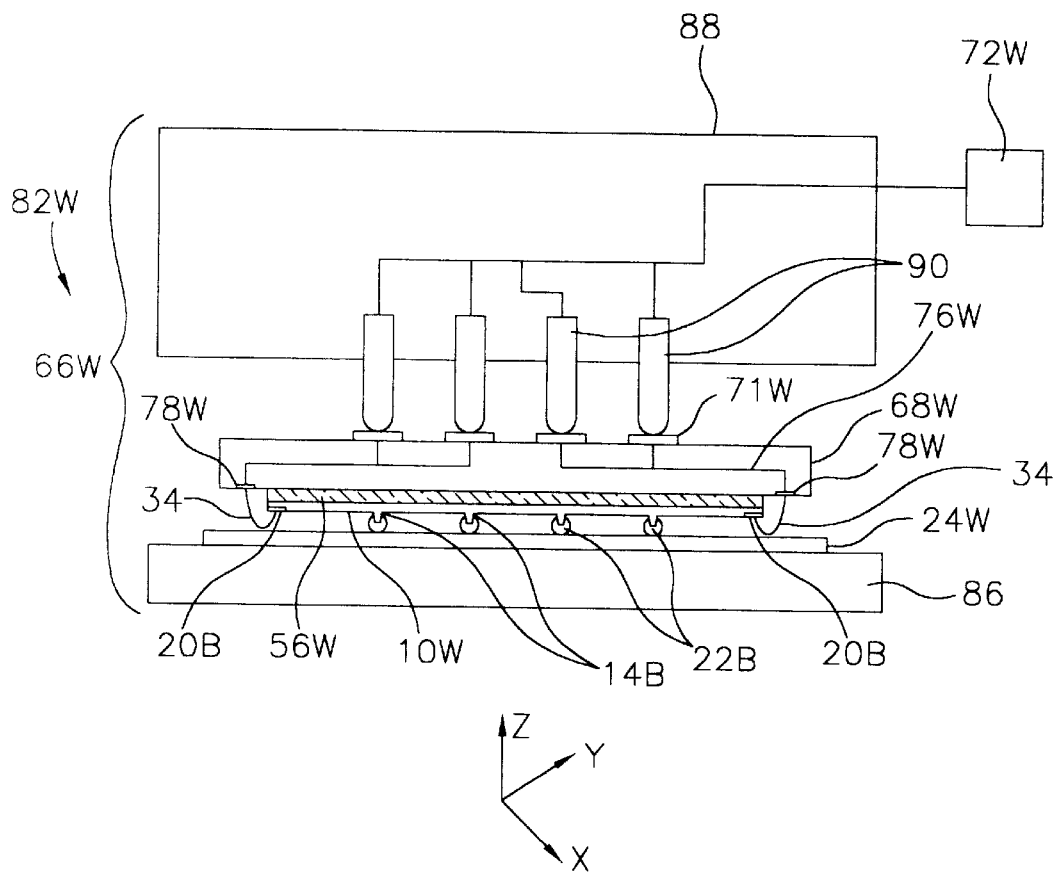
FIG. 7 is a schematic cross sectional view of a wafer level testing apparatus and testing system constructed in accordance with the invention.

Referring to FIG. 7, a wafer level testing system 82W suitable for testing a semiconductor component 24W, such as a wafer containing multiple dice, or a panel containing multiple chip scale packages, is illustrated. The component 24W includes bumped contacts 22B as previously described.

The testing system 82W includes the wafer level interconnect 10W constructed substantially as previously described, and mounted to a testing apparatus 66W. The testing apparatus 66W includes, or is in electrical communication with testing circuitry 72W. The testing apparatus 66w can be a conventional wafer probe handler, or probe tester, modified for use with the interconnect 10W. Wafer probe handlers and associated test equipment are commercially available from Electroglass, Advantest, Teradyne, Megatest, Hewlett-Packard and others. In this system 82W, the interconnect 10W takes the place of a conventional probe card.

The interconnect 10W includes contacts 14B configured to establish electrical communication with the bumped contacts 22B on the component 24W. The contacts 14B can be formed as previously described and shown in FIG. 2B. In addition, the interconnect 10W is mounted to a rigid base 68W using a compliant layer 56W formed substantially as previously described. The base 68W can comprise ceramic, plastic or glass filled resin. In addition, the base 68W can be fabricated substantially as previously described for base 68D (FIG. 5B). The base 68W includes bond pads 78W wire bonded to wires 34. The wires 34 are wire bonded to the bond pads 20B on the interconnect 10W in electrical communication with the contacts 14B. The base 68W also includes internal conductors 76W in electrical communication with the bond pads 78W and with land pads 71W formed on the base 68W.

The testing apparatus 66W also includes a wafer chuck 86 configured to support and move the component 24W in x, y and z directions as required. In particular, the wafer chuck 86 can be used to step the component 24W so that the dice, or chip scale packages, on the component 24W can be tested in groups. Alternately, the interconnect 10W can be configured to contact all of the bumped contacts 22B on the component 24W at the same time. Test signals can then be selectively applied and electronically switched as required, to selected dice or chip scale packages on the component 24W.

As also shown in FIG. 7, the interconnect 10W can mount to a probe card fixture 88 of the testing apparatus 66W. The probe card fixture 88 can be similar in construction to a conventional probe card fixture commercially available from manufacturers such as Packard Hughes Interconnect and Wentworth Laboratories. The probe card fixture 88 can be formed of an electrically insulating material such as FR-4 or ceramic. In addition, the testing apparatus 66W can include a force applying mechanism in the form of multiple spring loaded electrical connectors 90 associated with the probe card fixture 88. The spring loaded electrical connectors 90 are in electrical communication with the testing circuitry 72W.

The spring loaded electrical connectors 90 can be formed in a variety of configurations. One suitable configuration is known as a "POGO PIN" connector. This type of electrical connector includes a spring loaded pin adapted to contact and press against a flat surface to form an electrical connection. Pogo pin connectors are manufactured by Pogo Instruments, Inc., Kansas City, Kans. The spring loaded electrical connectors 90 can also comprise wires, pins or cables formed as spring segments or other resilient members.

In this embodiment the spring loaded electrical connectors 90 electrically contact the land pads 71W formed on the base 68W. This arrangement provides separate electrical paths from the testing circuitry 72W, through the spring loaded electrical connectors 90, through the land pads 71W, through the conductors 76W and through the contacts 14B to the bumped contacts 22B. During a test procedure, test signals can be applied to the integrated circuits on the component 24W using these separate electrical paths.

In addition to establishing electrical communication with the interconnect 10W, the spring loaded electrical connectors 90 also provide a biasing force necessary for biasing the interconnect 10W against the component 24W. Further details of a wafer level system similar to the system 82W are contained in U.S. patent application Ser. No. 08/797,719, now U.S. Pat. No. 6,060,891, filed Feb. 10, 1997, entitled "PROBE CARD FOR SEMICONDUCTOR WAFERS AND METHOD AND SYSTEM FOR TESTING WAFERS" which is incorporated herein by reference.

During a test procedures conductive using the test system 82W, the interconnect 10W can flex substantially as previously described to accommodate variations in the planarity of the bumped contacts 22B. In addition, the biasing force can be selected so that the component 24W remains substantially planar as the interconnect 10W flexes.

Thus the invention provides an improved interconnect for testing semiconductor components. The interconnect includes contacts designed to provide reliable electrical connections to planar or bumped component contacts with a minimal biasing force. In addition, the contacts on the interconnect are constructed to move in the z-direction to accommodate variations in the size or planarity of the component contacts.

While the invention has been described with reference to certain preferred embodiments, as will be apparent to those skilled in the art, certain changes and modifications can be made without departing from the scope of the invention as defined by the following claims.

What is claimed is:

1. A system for testing a semiconductor component comprising:

a testing apparatus comprising a base and a force applying mechanism attached to the base for applying a biasing force to the component;

an interconnect on the base comprising a thinned substrate having a thickness substantially less than that of the component, and a plurality of first contacts on the thinned substrate configured to electrically engage a plurality of second contacts on the component; and a compliant polymer layer attaching the thinned substrate to the base such that the thinned substrate can flex and the first contacts can move with the thinned substrate in a z-direction upon application of the biasing force to accommodate variations in a planarity of the second contacts, the compliant polymer layer comprising a conductive polymer configured to provide electrical paths to the first contacts.

2. The system of claim 1 wherein the second contacts comprise planar pads and the first contacts comprise penetrating projections configured to penetrate the pads.

3. The system of claim 1 wherein the second contacts comprise bumps or balls and the first contacts comprise projections configured to penetrate the bumps or the balls.

4. The system of claim 1 wherein the second contacts comprise bumps or balls and the first contacts comprise recesses configured to retain the bumps or the balls.

5. The system of claim 1 wherein the conductive polymer comprises an anisotropic adhesive.

6. A system for testing a semiconductor component comprising:

a testing apparatus comprising a wafer probe handler for applying a biasing force and testing circuitry for applying test signals to the component;

an interconnect on the wafer probe handler comprising a thinned substrate having a thickness of from about 0.002 inches to 0.014 inches, and a plurality of first contacts on the thinned substrate configured to electrically engage a plurality of second contacts on the component for establishing electrical communication with the testing circuitry; and a compliant polymer layer attaching the thinned substrate to the wafer probe handler such that the thinned substrate can flex and the first contacts can move with the thinned substrate in a z-direction upon application of the biasing force to accommodate variations in a planarity of the second contacts.

7. The system of claim 6 wherein the component comprises a semiconductor wafer comprising a plurality of semiconductor dice or packages.

8. The system of claim 6 wherein the component comprises a panel comprising a plurality of packages.

9. The system of claim 6 wherein the compliant polymer layer comprises a conductive polymer configured to provide electrical paths to the first contacts.

10. A system for testing semiconductor components contained on a wafer or a panel comprising:

a testing apparatus configured to apply test signals to the components; and an interconnect on the testing apparatus comprising a thinned substrate having a thickness of from about 0.002 inches to 0.014 inches, and a plurality of first contacts on the thinned substrate configured to make temporary electrical connections with a plurality of second contacts on the components;

the thinned substrate configured to flex, and the first contacts configured to move with the thinned substrate in a z-direction during making of the temporary electrical connections to accommodate variations in a planarity of the second contacts.

11. The system of claim 10 wherein the testing apparatus comprises a wafer prober.

12. The system of claim 10 wherein the components comprise dice on the wafer.

13. The system of claim 10 wherein the components comprise packages on the panel.

14. A system for testing a semiconductor component comprising:
- a testing apparatus configured to apply test signals to the component;
- an interconnect on the testing apparatus comprising a rigid substrate and a thinned substrate having a thickness substantially less than that of the component configured to flex upon contact with the component,
- a plurality of first contacts on the thinned substrate configured to electrically engage a plurality of second contacts on the component to apply the test signals, and to move in a z-direction with the thinned substrate to accommodate dimensional variations in the second contacts; and
- a compliant polymer layer between the rigid substrate and the thinned substrate.

15. The system of claim 14 wherein the component comprises a die or a package and the testing apparatus comprises a test carrier.

16. The system of claim 14 wherein the component is contained on a wafer or a panel containing a plurality of components and the testing apparatus comprises a wafer prober.

* * * * *